US008118081B2

(12) United States Patent
Zha et al.

(10) Patent No.: US 8,118,081 B2
(45) Date of Patent: Feb. 21, 2012

(54) HEAT DISSIPATION DEVICE WITH LOCKING TABS

(75) Inventors: Xin-Xiang Zha, Shenzhen (CN); Jer-Haur Kuo, Taipei Hsien (TW)

(73) Assignees: Fu Zhun Precision Industry (ShenZhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 710 days.

(21) Appl. No.: 12/248,012

(22) Filed: Oct. 8, 2008

(65) Prior Publication Data
US 2010/0032135 A1  Feb. 11, 2010

(30) Foreign Application Priority Data
Aug. 7, 2008  (CN) .......................... 2008 1 0303567

(51) Int. Cl.
*F28F 7/00* (2006.01)
*H05K 7/20* (2006.01)
*F16B 19/00* (2006.01)

(52) U.S. Cl. ......... 165/80.3; 165/78; 361/700; 361/704; 411/508

(58) Field of Classification Search ............ 165/78, 165/80.3; 361/700, 704; 411/508
See application file for complete search history.

(56) References Cited

U.S. PATENT DOCUMENTS

| 6,340,056 | B1 * | 1/2002 | Huang et al. | 165/185 |
| 6,765,799 | B1 * | 7/2004 | Huang | 361/709 |
| 6,772,828 | B1 * | 8/2004 | Chen | 165/78 |
| 6,883,591 | B2 * | 4/2005 | Lai | 165/78 |
| 7,032,650 | B1 * | 4/2006 | Tian | 165/80.3 |
| 7,174,955 | B2 * | 2/2007 | Zhong et al. | 165/185 |
| 7,697,294 | B2 * | 4/2010 | Li et al. | 361/709 |
| 7,733,653 | B1 * | 6/2010 | Horng | 361/704 |
| 2004/0040700 | A1 * | 3/2004 | Tsai et al. | 165/185 |
| 2005/0051297 | A1 * | 3/2005 | Kuo | 165/80.3 |
| 2006/0113062 | A1 * | 6/2006 | Yang | 165/80.3 |
| 2006/0144560 | A1 * | 7/2006 | Lo | 165/80.3 |
| 2007/0215318 | A1 * | 9/2007 | Chiang | 165/78 |
| 2008/0179043 | A1 * | 7/2008 | Ho | 165/78 |
| 2010/0025014 | A1 * | 2/2010 | Zha | 165/80.3 |

* cited by examiner

Primary Examiner — Cheryl J Tyler
Assistant Examiner — Brandon M Rosati
(74) Attorney, Agent, or Firm — Altis Law Group, Inc.

(57) ABSTRACT

A heat dissipation device (100) includes a fin assembly (10) having a plurality of fins (12). Each fin includes a locking tab (126b) with a connecting end (1268), a free end (1269), a hole (1261) adjacent to the connecting end, a hook (1262) adjacent to the free end, and a tongue (1263) between the hole and the hook. A punched hole (127b) in each fin is adjacent to the locking tab, which extends through the punched hole of an adjacent fin. The hook of the locking tab engages the hole in the locking tab of the adjacent fin, locking them together.

13 Claims, 8 Drawing Sheets

HEAT DISSIPATION DEVICE WITH LOCKING TABS

BACKGROUND

1. Technical Field

The disclosure relates to heat dissipation devices, and particularly to a heat dissipation device for use with an electronic component.

2. Description of Related Art

It is well known that heat is generated during operations of a variety of electronic components, such as integrated circuit chips. To ensure normal and safe operations, heat dissipation devices are employed to dissipate the generated heat away from these electronic components.

A heat dissipation device typically includes a metal base and a fin assembly provided on the metal base. The fin assembly includes a plurality of metal fins spaced from each other. The metal fins each have a main body, a top flange provided at a top side edge of the main body, and a bottom flange provided at a bottom side edge of the main body. The flanges extend perpendicularly and outwardly from the main body. The metal fins together form the fin assembly, and the bottom flanges of the metal fins cooperatively form a flat bottom surface. The flat bottom surface is employed to attach the fin assembly to the metal base.

Each of the top and bottom flanges is generally provided with a locking mechanism whereby the metal fins can be interlocked. However, the locking mechanism provided at the top and bottom flanges generally cannot firmly interlock the metal fins. In addition, the locking mechanism provided at the bottom flange reduces flatness of the flat bottom surface through which the fin assembly is attached to the metal base, such that the fin assembly cannot be snugly attached to the metal base.

What is needed, therefore, is a heat dissipation device which can overcome the above-mentioned disadvantages.

SUMMARY

The disclosure relates to a heat dissipation device applicable for a heat generating electronic component. According to an exemplary embodiment of the disclosure, the heat dissipation device includes a fin assembly. The fin assembly includes an interlocked plurality of metal fins. Each metal fin includes a main body provided with a locking tab. The locking tab has a connecting end and a free end. The locking tab includes a hole located adjacent to the connecting end, a hook located adjacent to the free end, and a tongue located between the hole and the hook. A void is provided adjacent to the locking tab. The locking tab of each metal fin extends through the void of an adjacent metal fin. The hook of the locking tab of the metal fin engages the hole of the locking tab of the adjacent metal fin to interlock the two metal fins. The tongue of the locking tab of each metal fin abuts the adjacent metal fin.

Other advantages and novel features of the disclosure will become more apparent from the following detailed description of embodiments when taken in conjunction with the accompanying drawings.

DETAILED DESCRIPTION OF THE EMBODIMENTS

Figure 1:
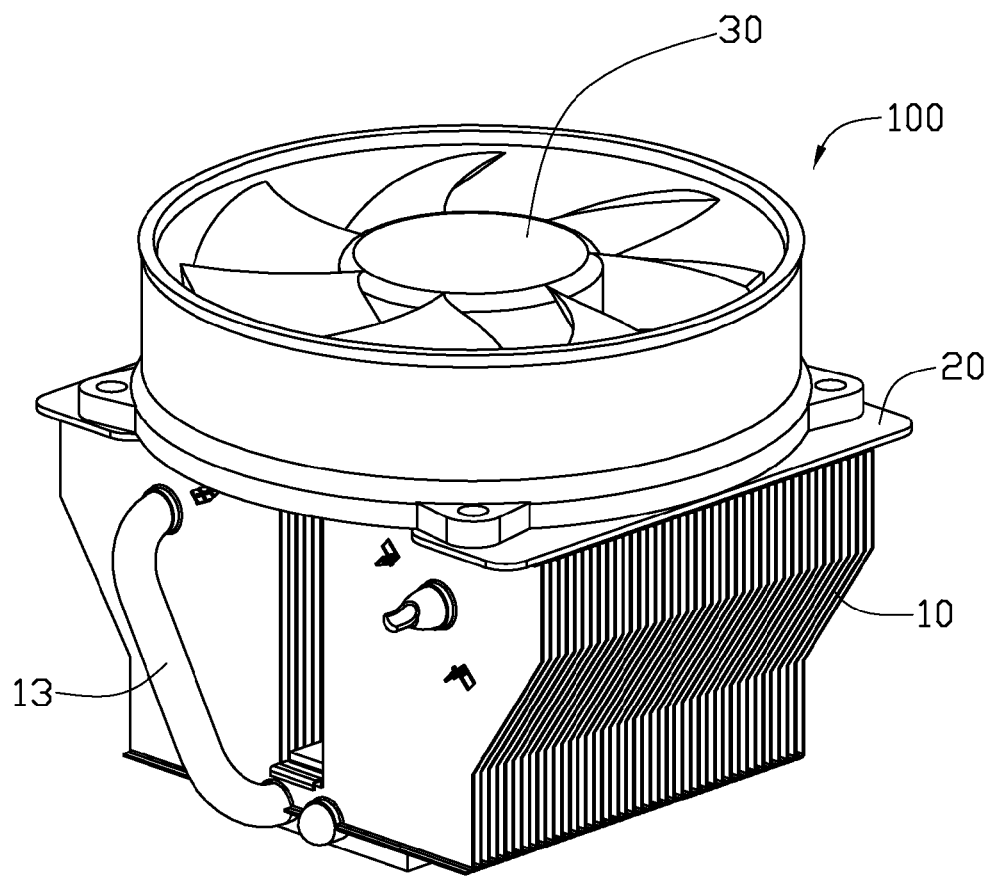
FIG. 1 is an assembled view of a heat dissipation device in accordance with a first embodiment of the disclosure.

Reference will now be made to the drawing figures to describe the various embodiments in detail.

Figure 2:
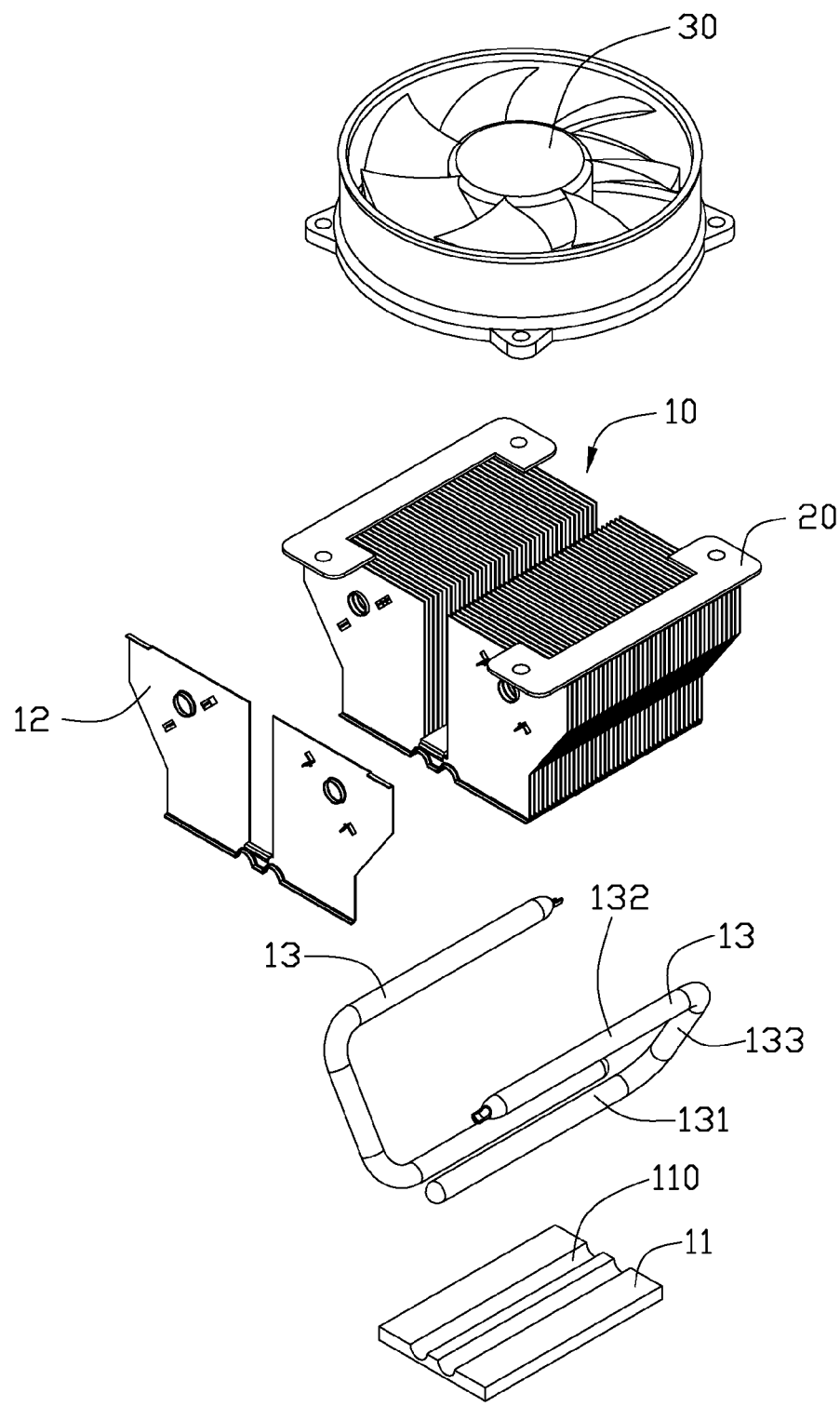
FIG. 2 is an exploded, isometric view of the heat dissipation device of FIG. 1.

Referring to FIGS. 1 and 2, a heat dissipation device 100 in accordance with a first embodiment of the disclosure is shown. The heat dissipation device 100 includes a fin assembly 10, a metal base 11, two heat pipes 13, two fixing plates 20, and a cooling fan 30.

The metal base 11 is rectangular and copper or copper alloy. The metal base 11 has a pair of semi-circular grooves 110 defined at a top surface thereof.

Each of the heat pipes 13 is generally U-shaped, including an evaporating section 131, a condensing section 132, and a connecting section 133 located therebetween. The condensing section 132 is located above and parallel to the evaporating section 131. The connecting section 133 is perpendicular to the evaporating section 131 and the condensing section 132.

Figure 3:
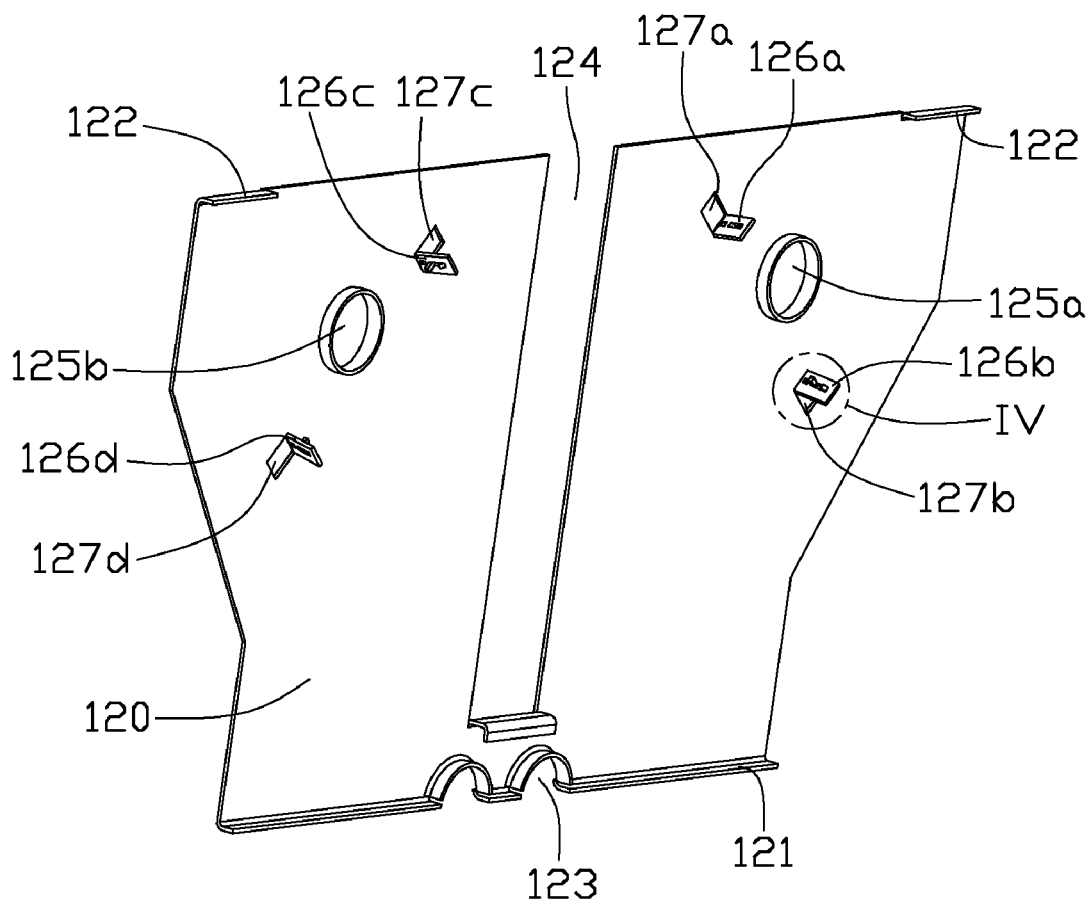
FIG. 3 is an isometric view of a single metal fin of a fin assembly of the heat dissipation device of FIG. 1.

The fin assembly 10 includes a plurality of interlocked. metal fins 12 Referring also to FIG. 3, each of the metal fins 12 includes a main body 120, a bottom flange 121 bent perpendicularly and outwardly from a bottom side edge of the main body 120, and a pair of spacing tabs 122 provided at two opposite sides of a top side edge of the main body 120. A pair of semi-circular grooves 123 is defined in the bottom flange 121. The main body 120 is divided into half by a slot 124 vertically provided through a middle portion of the main body 120. The slot 124 extends downwardly from the top side edge toward the bottom side edge of the main body. A pair of through holes 125a, 125b is defined in the main body 120 for extension of the heat pipes 13. The through holes 125a, 125b are located adjacent to the top side edge of the main body 120, and respectively provided at the two halves of the main body 120. The through holes 125a, 125b are symmetrically disposed with respect to the slot 124.

Each metal fin 12 is provided with four locking tabs 126a, 126b, 126c, 126d at the main body 120. The locking tabs 126a, 126b, 126c, 126d are integrally formed with the main body 120 by punching respective portions of the main body 120 outwardly, with punched holes 127a, 127b, 127c, 127d respectively left adjacent to the locking tabs 126a, 126b, 126c, 126d after punching. Each of the locking tabs 126a, 126b, 126c, 126d is angularly disposed towards the middle portion of the main body 120 where the slot 124 is defined.

The four locking tabs 126a, 126b, 126c, 126d are divided into two groups, i.e., a first group comprised of the locking tabs 126a, 126b which are provided around the through hole 125a, and a second group comprised of the locking tabs 126c, 126d which are provided around the through hole 125b. In the first group, the locking tab 126a is positioned above the through hole 125a and adjacent to the slot 124, and the locking tab 126b is positioned below the through hole 125a and remote from the slot 124. The locking tabs 126a, 126b and the through hole 125a are substantially arranged in a line. In the second group, the locking tab 126c is positioned above the through hole 125b and adjacent to the slot 124, and the locking tab 126d is positioned below the through hole 125b and remote from the slot 124. The locking tabs 126c, 126d and the through hole 125b are substantially arranged in a line.

Figure 4:
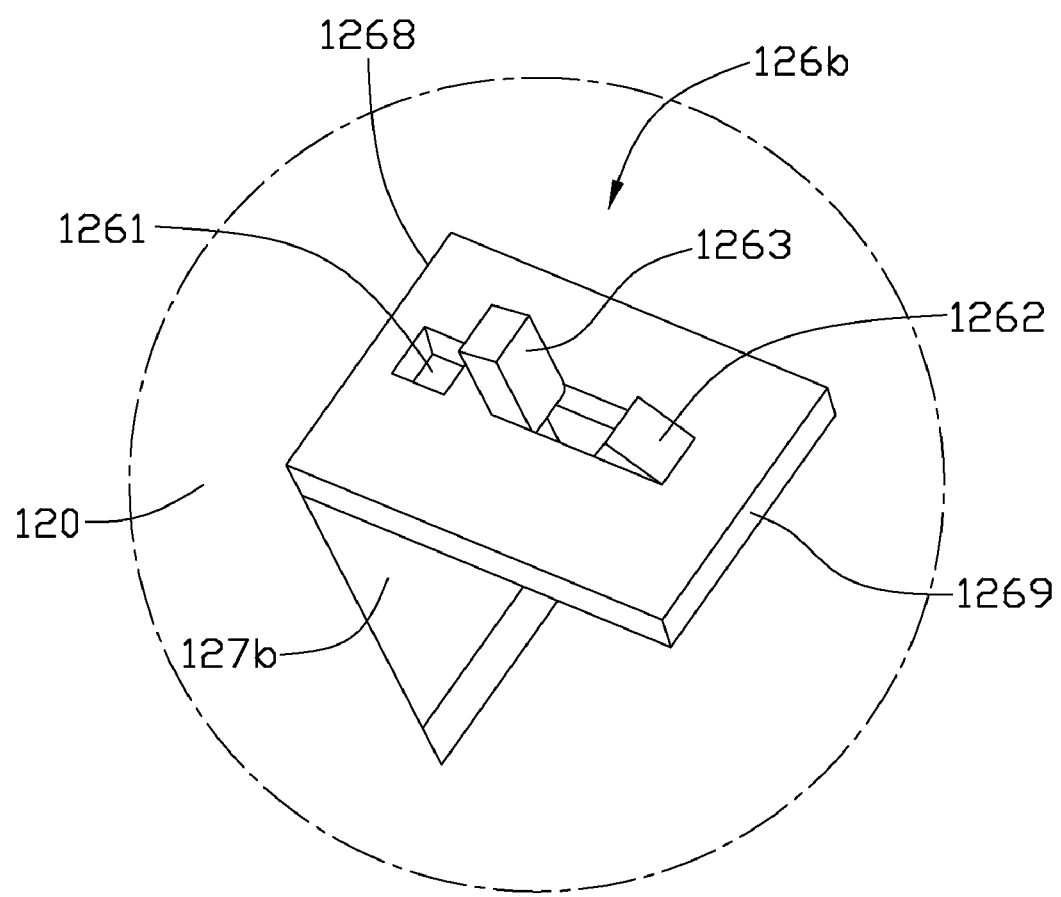
FIG. 4 is an enlarged view of circled portion IV of FIG. 3.

The locking tabs 126a, 126b, 126c, 126d each have an identical structure, and are described in detail using locking tab 126b as an example. Referring also to FIG. 4, the locking tab 126b is positioned perpendicular to the main body 120. The locking tab 126b has a connecting end 1268 connected with the main body 120, and a free end 1269 remote from the main body 120. The locking tab 126b includes a first locking unit 1261 located adjacent to the connecting end 1268 of the locking tab 126b, a second locking unit 1262 located adjacent to the free end 1269 of the locking tab 126b, and a tongue 1263 located between the first and the second locking units 1261, 1262. In this embodiment, the first locking unit 1261 is a hole defined in the locking tab 126b, and the second locking unit 1262 is a hook protruding outwardly from the locking tab 126b. The tongue 1263 is disposed perpendicular to the locking tab 126b. The first locking unit 1261, the second locking unit 1262 and the tongue 1263 are arranged in a line at a middle portion of the locking tab 126b.

In assembly, referring to FIGS. 1-2, the metal fins 12 are interlocked to form the fin assembly 10. The semi-circular grooves 110 of the metal base 11 and the semi-circular grooves 123 of the metal fins 12 cooperatively form two circular grooves receiving the evaporating sections 131 of the two heat pipes 13 therein, respectively. The condensing sections 132 of the heat pipes 13 are respectively inserted into the through holes 125a, 125b of the metal fins 12. The cooling fan 30 is attached to the fin assembly 10 via the fixing plates 20. The slots 124 of the metal fins 12 are employed to receive a clip (not shown) therein for securing the heat dissipation device 100 to a heat source such as a heat generating electronic component (not shown).

Figure 5:
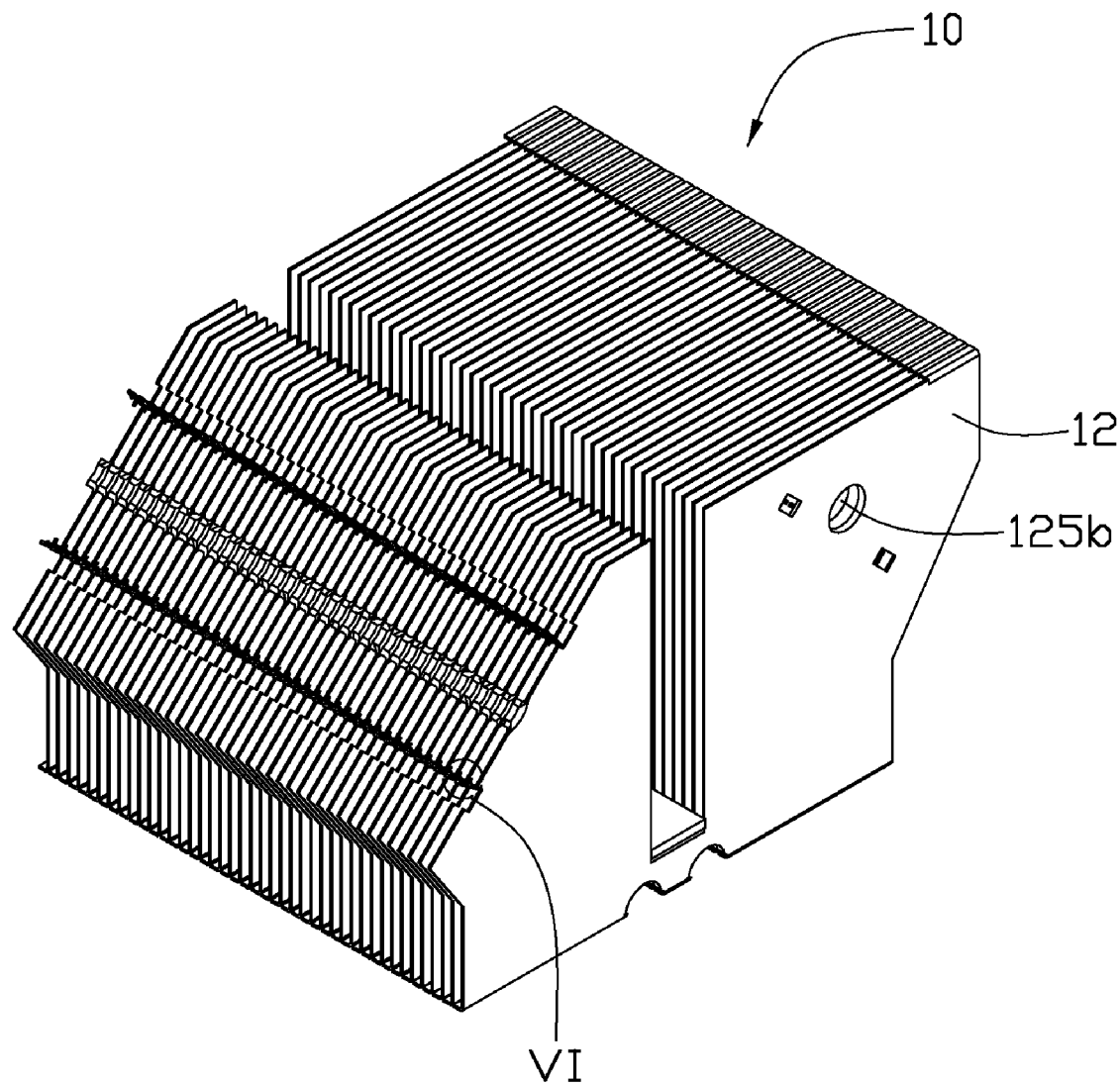
FIG. 5 is a partially sectioned, isometric view of a fin assembly of the heat dissipation device of FIG. 1.
Figure 6:
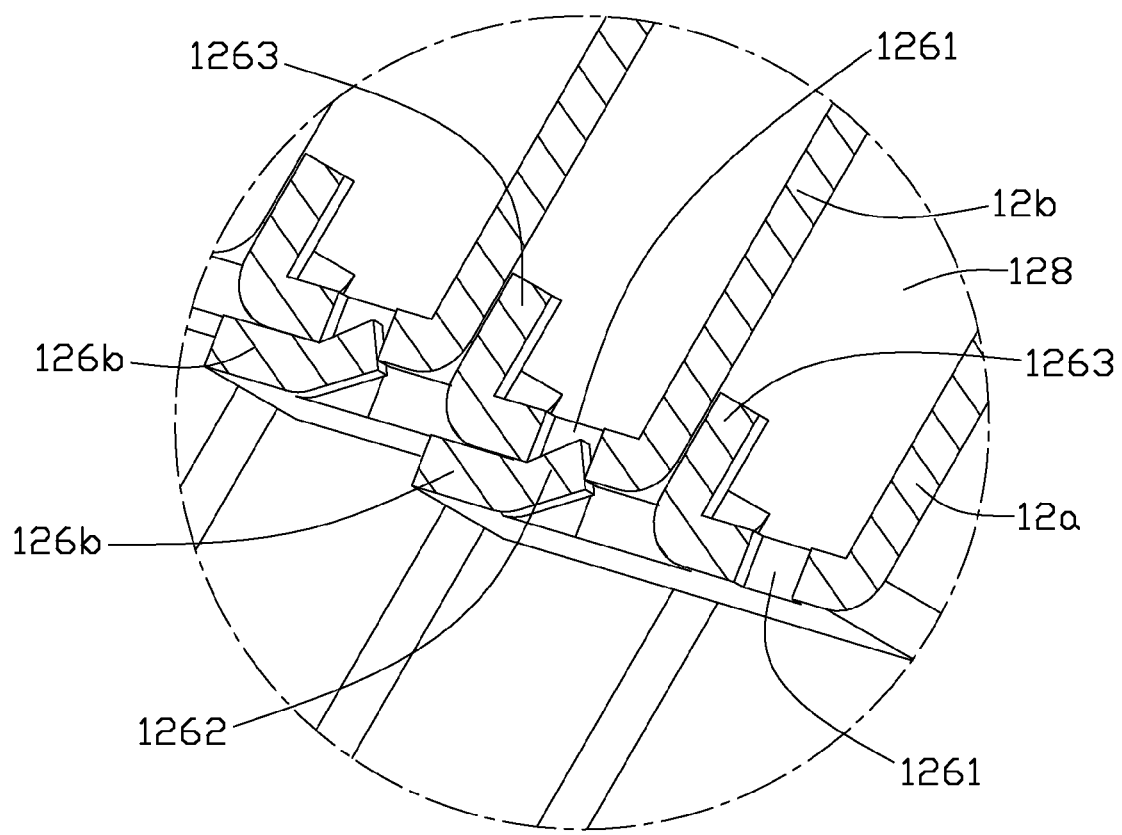
FIG. 6 is an enlarged view of circled portion VI of FIG. 5.

Referring to FIGS. 5-6, during assembly of the metal fins 12, the locking tabs 126a, 126b, 126c, 126d of a rear metal fin 12a extend respectively through the punched holes 127a, 127b, 127c, 127d of a front metal fin 12b and engage with the locking tabs 126a, 126b, 126c, 126d of the front metal fin 12b. In particular, as shown in FIG. 6, the locking tab 126b of the rear metal fin 12a extends through the punching hole 127b of the front metal fin 12b, and the hook 1262 of the locking tab 126b of the rear metal fin 12a engages the hole 1261 of the locking tab 126b of the front metal fin 12b, to thereby interlock the rear and the front metal fins 12a, 12b. In the locked position, the tongue 1263 of the locking tab 126b of the rear metal fin 12a abuts a rear surface 128 of the front metal fin 12b, whereby the rear and the front metal fins 12a, 12b are firmly interlocked.

In the present heat dissipation device 100, the metal fins 12 of the fin assembly 10 can be easily assembled, and further, firmly interlock via the locking tabs 126a, 126b, 126c, 126d. Furthermore, since the locking tabs 126a, 126b, 126c, 126d are not provided at the bottom flange 121 of the main body 120, the locking tabs 126a, 126b, 126c, 126d do not affect the surface flatness of a bottom surface of the bottom flanges 121 when the metal fins 12 are assembled, whereby the fin assembly 10 can be snugly attached to the metal base 11.

Figure 7:
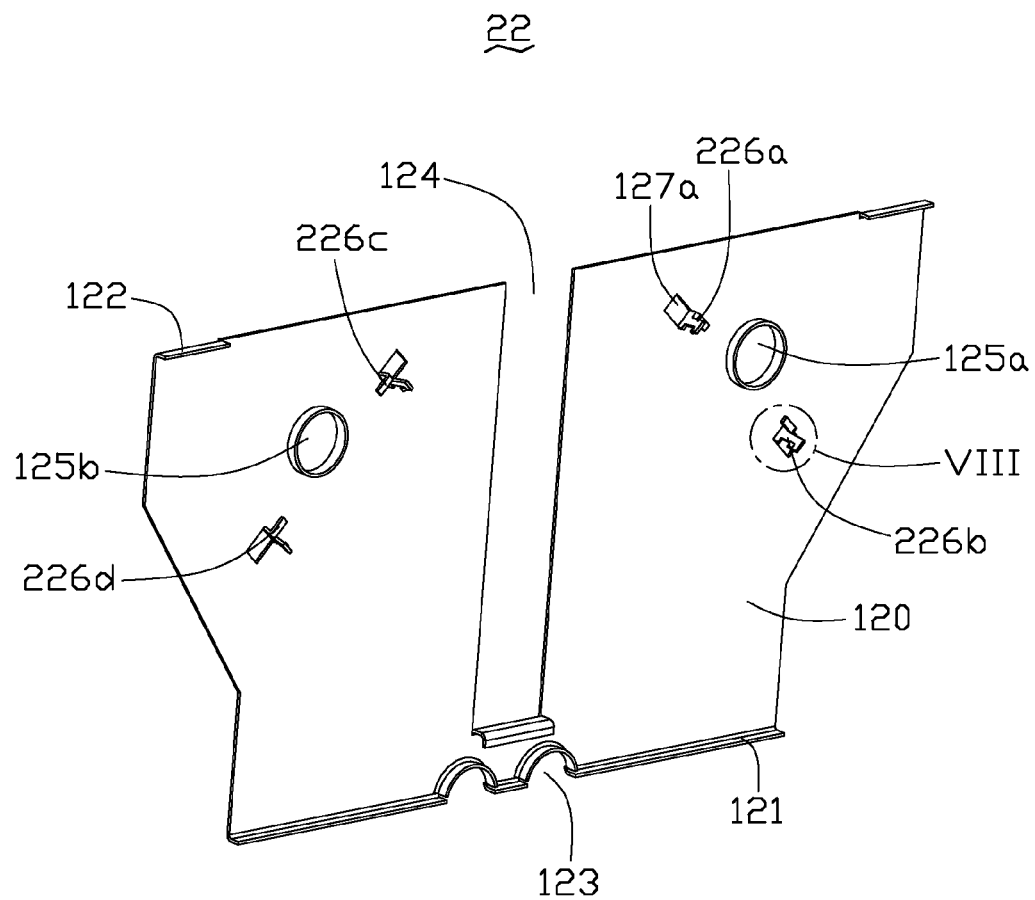
FIG. 7 is an isometric view of a single metal fin of a fin assembly in accordance with a second embodiment of the disclosure.
Figure 8:
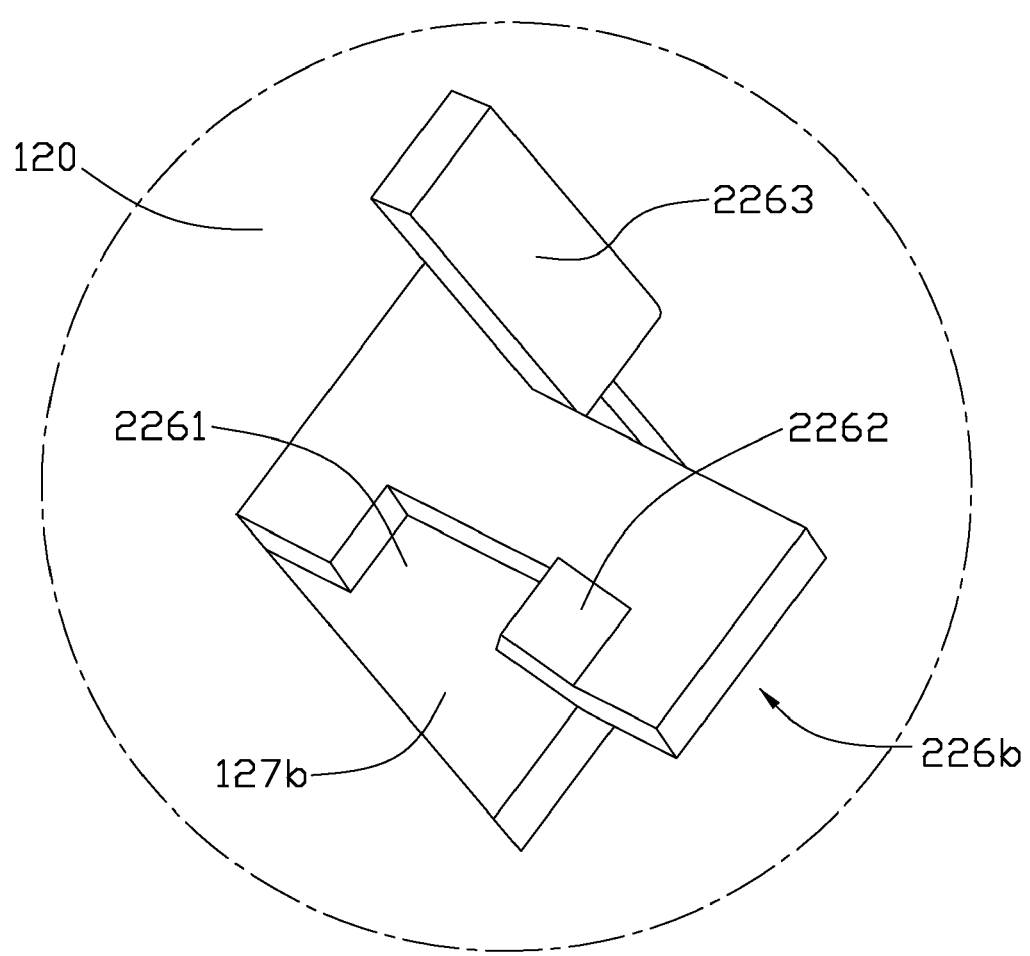
FIG. 8 is an enlarged view of circled portion VIII of FIG. 7.

Referring to FIGS. 7-8, a second embodiment of the metal fin 22 is shown, differing from the first embodiment only in the locking tabs 226a, 226b, 226c, 226d, wherein, here, the first locking unit 2261 is a groove defined at the lateral side of the locking tab 226b, and the second locking unit 2262 is a hook protruding outwardly from the locking tab 226b. In assembly, the hook 2262 of the locking tab 226b of a rear metal fin engages the groove 2261 of the locking tab 226b of a front metal fin, to thereby interlock the rear and the front metal fins. In the meanwhile, the tongue of the locking tab 226b of the rear metal fin abuts the front metal fin, whereby the rear and the front metal fins are firmly interlocked.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
a fin assembly, the fin assembly comprising an interlocked plurality of metal fins, each metal fin including;
a main body provided with at least one locking tab, the at least one locking tab comprising:
a connecting end connected with the main body and a free end remote from the main body;
a first locking unit located adjacent to the connecting end of the at least one locking tab;
a second locking unit located adjacent to the free end of the at least one locking tab; and
a tongue between the first and the second locking units; and
a void defined in the main body and disposed adjacent to the at least one locking tab;
wherein the at least one locking tab of each metal fin extends through the void of an adjacent metal fin, the second locking unit of the at least one locking tab of the each metal fin engages the first locking unit of the at least one locking tab of the adjacent metal fin to interlock the each metal fin and the adjacent metal fin, and the tongue of the at least one locking tab of the each metal fin abuts the adjacent metal fin.

2. The heat dissipation device of claim 1, wherein the first locking unit is a hole defined in the at least one locking tab, the second locking unit is a hook protruding outwardly from the at least one locking tab, and the tongue is perpendicular to the at least one locking tab.

3. The heat dissipation device of claim 2, wherein the hole, the tongue and the hook are arranged in a line on a middle portion of the at least one locking tab.

4. The heat dissipation device of claim 1, wherein the main body is divided into half by a slot vertically provided through a middle portion of the main body.

5. The heat dissipation device of claim 4, wherein two through holes are defined in the main body and respectively provided at the two halves of the main body, and the at least one locking tab includes a plurality of locking tabs, some of which are disposed around one of the through holes, and the others of which are disposed around the other through hole.

6. The heat dissipation device of claim 5, wherein the locking tabs are angularly disposed towards the middle portion of the main body.

7. The heat dissipation device of claim 1, wherein two through holes are defined in the main body, the at least one locking tab includes four locking tabs divided into two groups, with the two locking tabs of one group around one of the through holes, and the two locking tabs of the other group around the other through hole.

8. The heat dissipation device of claim 7, wherein one of the two locking tabs of each group is positioned above a corresponding through hole and adjacent to a middle portion of the main body, and the other locking tab of each group is positioned below the corresponding through hole and remote from the middle portion of the main body.

9. The heat dissipation device of claim 8, wherein the locking tabs are angularly disposed towards the middle portion of the main body.

10. The heat dissipation device of claim 8, wherein a slot is vertically provided through the middle portion of the main body to divide the main body into two halves, and the two through holes are respectively provided at the two halves of the main body.

11. A heat dissipation device, comprising:
a metal base;
a fin assembly provided on the metal base, the fin assembly comprising an interlocked plurality of metal fins, each of the metal fins comprising:
  a main body provided with a plurality of locking tabs, each of the locking tabs comprising:
    a first locking unit adjacent to the main body;
    a second locking unit remote from the main body; and
    a tongue between the first and the second locking units; and
  a void defined in the main body and disposed adjacent to each of the locking tabs;
wherein the locking tabs of each metal fin extend respectively through the voids of an adjacent metal fin, the second locking units of the locking tabs of the each metal fin engaging respectively the first locking units of the locking tabs of the adjacent metal fin to interlock the each metal fin and the adjacent metal fin, and the tongues of the locking tabs of the each metal fin abutting the adjacent metal fin;
a heat pipe thermally interconnecting the metal base with the fin assembly; and
a cooling fan provided adjacent to the fin assembly.

12. The heat dissipation device of claim 11, wherein the first locking unit is a hole defined in the each locking tab, the second locking unit is a hook protruding outwardly from the each locking tab, and the tongue is disposed perpendicular to the each locking tab, and wherein the hole, the tongue and the hook are arranged in a line at a middle portion of the each locking tab.

13. The heat dissipation device of claim 11, wherein the each metal fin has a bottom flange bent perpendicularly from the body and snugly attached to the base.

\* \* \* \* \*